(12) United States Patent
Mehrad et al.

(10) Patent No.: US 7,045,410 B2
(45) Date of Patent: May 16, 2006

(54) METHOD TO DESIGN FOR OR MODULATE THE CMOS TRANSISTOR THRESHOLD VOLTAGE USING SHALLOW TRENCH ISOLATION (STI)

(75) Inventors: Freidoon Mehrad, Plano, TX (US); Amitava Chatterjee, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 20 days.

(21) Appl. No.: 10/899,844

(22) Filed: Jul. 27, 2004

(65) Prior Publication Data

US 2006/0024911 A1 Feb. 2, 2006

(51) Int. Cl.
*H01L 21/762* (2006.01)
*H01L 21/8238* (2006.01)

(52) U.S. Cl. ............... 438/217; 438/221; 438/223; 257/E27.064; 257/E21.633; 257/E21.642

(58) Field of Classification Search .......... 438/433, 438/FOR. 267, 217, 221, 223; 257/E27.064, 257/E21.633, E21.642
See application file for complete search history.

(56) References Cited

U.S. PATENT DOCUMENTS

| 4,523,369 | A | * | 6/1985 | Nagakubo | 438/433 |
|---|---|---|---|---|---|
| 5,719,085 | A | | 2/1998 | Moon et al. | |
| 5,780,353 | A | * | 7/1998 | Omid-Zohoor | 438/433 |
| 5,807,789 | A | | 9/1998 | Chen et al. | |
| 5,863,827 | A | | 1/1999 | Joyner | |
| 5,937,309 | A | | 8/1999 | Chuang | |
| 5,956,598 | A | | 9/1999 | Huang et al. | |
| 5,960,276 | A | * | 9/1999 | Liaw et al. | 438/224 |
| 6,030,882 | A | * | 2/2000 | Hong | 438/433 |
| 6,040,232 | A | | 3/2000 | Gau | |
| 6,180,490 | B1 | | 1/2001 | Vassiliev et al. | |
| 6,225,187 | B1 | | 5/2001 | Huang et al. | |
| 6,245,639 | B1 | | 6/2001 | Tsai et al. | |
| 6,492,220 | B1 | * | 12/2002 | Ikeda | 438/221 |
| 6,524,930 | B1 | | 2/2003 | Wasshuber et al. | |
| 6,562,675 | B1 | | 5/2003 | Watt | |
| 6,569,750 | B1 | * | 5/2003 | Kim et al. | 438/524 |
| 6,576,558 | B1 | | 6/2003 | Lin et al. | |
| 6,649,461 | B1 | | 11/2003 | Lai et al. | |
| 6,667,224 | B1 | | 12/2003 | Watt et al. | |
| 6,717,231 | B1 | | 4/2004 | Kim et al. | |
| 6,740,944 | B1 | | 5/2004 | McElheny et al. | |
| 6,746,936 | B1 | * | 6/2004 | Lee | 438/445 |
| 2002/0086498 | A1 | * | 7/2002 | Oda et al. | 438/424 |
| 2003/0111708 | A1 | * | 6/2003 | Hwang et al. | 257/514 |
| 2003/0181004 | A1 | | 9/2003 | Watt | |

OTHER PUBLICATIONS

U.S. Appl. No. 10/899,663, filed Jul. 27, 2004, Mehrotra et al.
U.S. Appl. No. 10/899,664, filed Jul. 27, 2004, Chatterjee et al.

* cited by examiner

*Primary Examiner*—George Fourson
(74) *Attorney, Agent, or Firm*—Peter K. McLarty; W. James Brady, III; Frederick J. Telecky, Jr.

(57) ABSTRACT

A method (200) of forming an isolation structure is disclosed, and includes forming a patterned isolation hard mask layer (206, 212) having an isolation opening associated therewith over a semiconductor body. An implant into the isolation opening is then performed (214), followed by forming an isolation trench (216) in the semiconductor body associated with the isolation opening. The isolation trench is then filled with a dielectric material (218).

6 Claims, 9 Drawing Sheets

METHOD TO DESIGN FOR OR MODULATE THE CMOS TRANSISTOR THRESHOLD VOLTAGE USING SHALLOW TRENCH ISOLATION (STI)

FIELD OF INVENTION

The present invention relates generally to semiconductor devices and more particularly to methods for forming shallow trench isolation structures in the manufacture of semiconductor devices.

BACKGROUND OF THE INVENTION

In the area of semiconductor device fabrication, the MOS transistor is a basic building block, wherein the transistor can be controlled to operate either in a digital or analog manner. In the fabrication of MOS transistors, source and drain regions are doped oppositely to that of a body region in a semiconductor substrate. For example, as illustrated in prior art FIG. 1, source/drain regions 12 are formed in a semiconductor body 14 of a MOS transistor, wherein the source/drain regions 12 are an n-type material and the body region 14 is a p-type material (an NMOS transistor). A gate structure 16, for example, a polysilicon gate electrode 18 overlying a gate dielectric 20, overlies a channel region 22 of the semiconductor body. Sidewall spacers 24 reside on lateral edges of the gate structure 16 to facilitate the spacing of extension regions 26 associated with the source/drains 12. Based on the gate structure 16, a distance between the source/drain regions 12 is defined, which is often referred to as a channel length "L", while a depth of the transistor, or extent in which the transistor extends transverse to the channel, is often referred to as a width "W" of the device. The width-to-length ratio (W/L) is a factor that substantially influences the drive current of the device, as well as other device performance characteristics.

As transistor devices constantly get scaled down to improve device density, both the width "W" and the channel length "L" dimensions are reduced, giving rise to various fabrication and device performance issues. One problem associated with a reduction in the transistor width "W" is experienced when shallow trench isolation (STI) is employed for device isolation, and that problem is sometimes referred to as the inverse narrow width effect (INWE). The mechanisms by which the INWE arises are not fully understood, however, various hypotheses exist. For example, it is postulated that the INWE is related to fields generated by transistors that are concentrated at sharp corners between the semiconductor body and the trench isolation structures. In addition, or alternatively, the INWE may be influenced by the diffusion of dopant atoms from the semiconductor body into the isolation structures, thereby reducing the dopant concentration of the channel dopant regions of the transistor near the STI structure.

Referring to prior art FIG. 2, a portion of a partially fabricated semiconductor device is illustrated, wherein a plurality of isolation structures 30, or STI trenches, are formed in the semiconductor body 14, thereby separating the body into isolation regions 32 and active areas 34, respectively. Subsequently, transistor devices such as MOS transistors are formed in the active areas 34, wherein a width dimension "W" of the MOS transistors extends between the isolation structures 30 as illustrated. As MOS transistor scaling continues, the distance "W" between the isolation structures decreases.

As illustrated in prior art FIG. 3, after source/drain regions 12 and gate structures 16 are formed in the active areas, portions 40 of the active regions near the STI trenches 30 will tend to suffer from the INWE. In such instances, when the gate (not shown) is biased, the field lines that for at the overlapping gate electrode 18 are focused by the edge geometry of the channel, and therefore at the edges of the channel, and an inversion layer is formed at lower voltages than at the center portion of the device in the middle of the active area. Consequently, less bias is needed for application to the gate to invert the channel across its full width, thereby lowering the threshold voltage of the device. With a decrease in threshold voltage, sub-threshold leakage may undesirably increase. At large transistor widths "W" the above effect does not greatly influence the device performance, however, as "W" continues to scale downward, the impact of INWE is greater. For example, as illustrated in prior art FIGS. 4 and 5, a plan view of two portions of a MOS transistor are provided, wherein the two devices have differing transistors widths. For example, in prior art FIG. 4, an active area 50 is defined between two laterally extending STI isolation regions 52. A conductive gate electrode 54 extends vertically across the active area between the two isolation regions 52, thereby defining a channel region 56 thereunder in the active area. Due to the INWE, a region 58 exists under the channel near the STI that contributes to a reduced device threshold voltage. For a device width W1, the net impact of the region 58 due to the INWE is relatively insignificant, however, as illustrated in prior art FIG. 5, for smaller transistor widths W2, the INWE will have a substantially greater impact on the resulting device performance.

Therefore there remains a need in the art for improved STI processes and techniques that reduce or alter the impact of the INWE in order to reduce or mitigate the device performance problems associated therewith.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The invention provides methods for forming isolation structures and STI trenches in a semiconductor device, which may be carried out in a variety of semiconductor manufacturing processes. According to one aspect of the present invention, a method of forming an isolation structure is provided wherein an isolation hard mask is formed over a semiconductor body and patterned to define an isolation region having a width associated therewith in the semiconductor body. An implant is performed into the isolation region using the patterned isolation hard mask as the implant mask, resulting in a threshold voltage compensation region having a width that is greater than the width of the isolation region. A trench is then formed in the semiconductor body using the isolation hard mask as the etch mask. The trench has a width and a depth associated therewith, wherein the trench width is less than the width of the compensation region and the depth is greater than a depth of the compensation region. Accordingly, the trench breaks the compensation region into sub-regions that reside along a top portion of the trench sidewalls.

According to another aspect of the present invention, the semiconductor body region comprises material of a first conductivity type, and the compensation implant is performed with a dopant of a second, different conductivity type. Consequently, the resulting threshold voltage compensation sub-regions provide a compensating dopant that may be used to alter the threshold voltages for PMOS and NMOS transistors. In one example, the compensating implant may be employed to make the threshold voltages of the PMOS and NMOS transistors more balanced. For example, by providing an n-type implant into a p-type semiconductor body using the patterned isolation hard mask prior to STI trench formation in both NMOS and PMOS device regions, the threshold voltage of the PMOS devices is increased while the threshold voltage of the NMOS devices is decreased. Consequently, a lack of balance between the threshold voltages associated with CMOS technology is mitigated without requiring any additional masks.

According to one aspect of the present invention, patterning of the isolation hard mask comprises forming an isolation opening therethrough substantially all the way down to the semiconductor body surface. Subsequently, the threshold voltage compensation implant comprises an angled implant to thereby form the threshold voltage compensation region having a width that is greater than the subsequently formed trench. In another aspect of the present invention, the patterning of the isolation hard mask comprises forming an isolation opening part way through the hard mask. The compensation implant is then a non-angled implant wherein the isolation hard mask is sufficiently thick enough to block dopant in the active areas, but thin enough to allow some of the dopant to reach the semiconductor body in the isolation regions. The travel of the dopant through a portion of the thinned isolation hard mask causes some scattering, leading to some lateral straggle, wherein a resulting compensation region in the semiconductor body is greater than a width of the isolation region.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

DETAILED DESCRIPTION OF THE INVENTION

Figure 1:
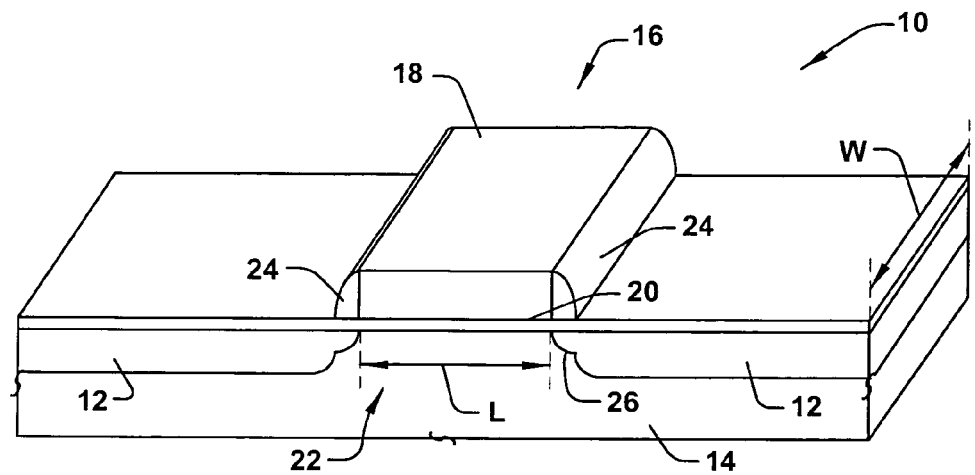
FIG. 1 is a prior art fragmentary perspective view of a MOS transistor.
Figure 2:
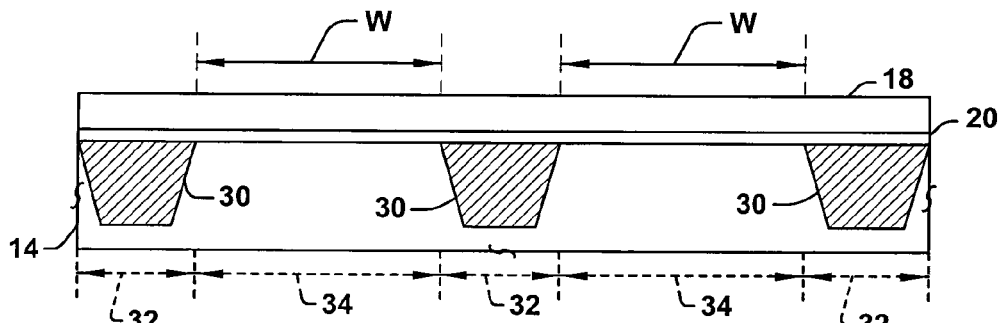
FIGS. 2 and 3 are prior art partial side elevation views in section illustrating a portion of a MOS transistor in various points in a manufacturing process that experiences the inverse narrow width effect (INWE)
Figure 3:
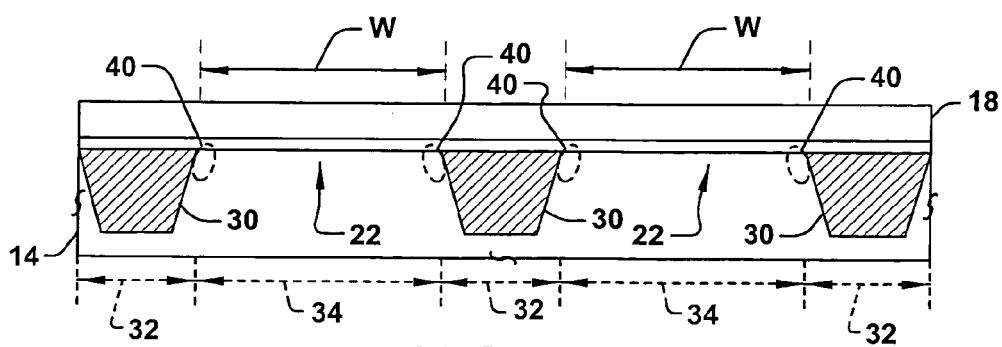
Figure 4:
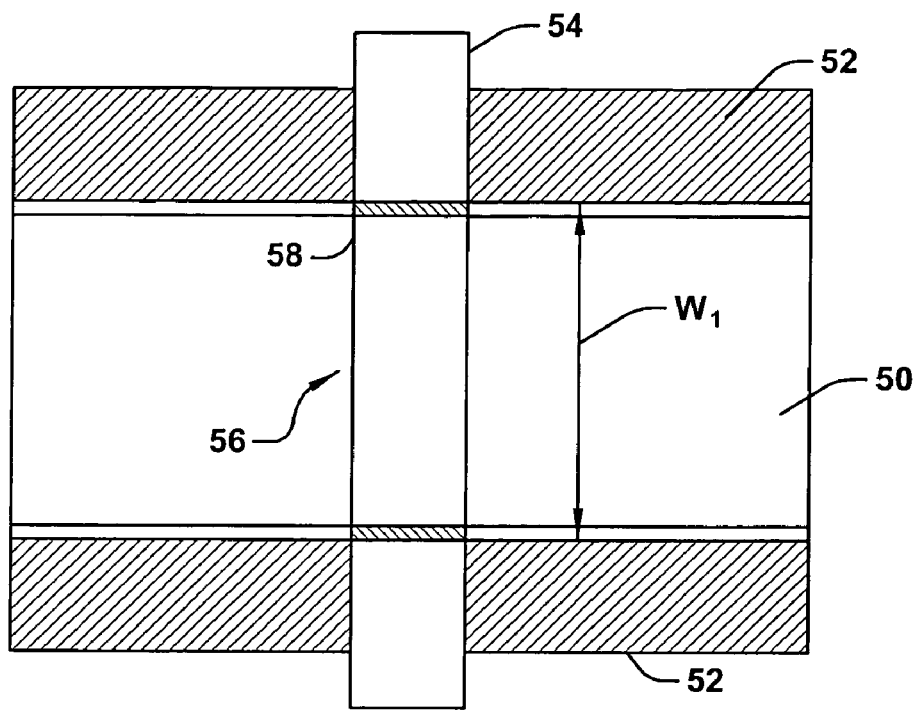
FIGS. 4 and 5 are prior art partial side elevation views in section illustrating a MOS transistor and how, as a transistor dimension decreases in a width direction, the INWE becomes more pronounced.
Figure 5:
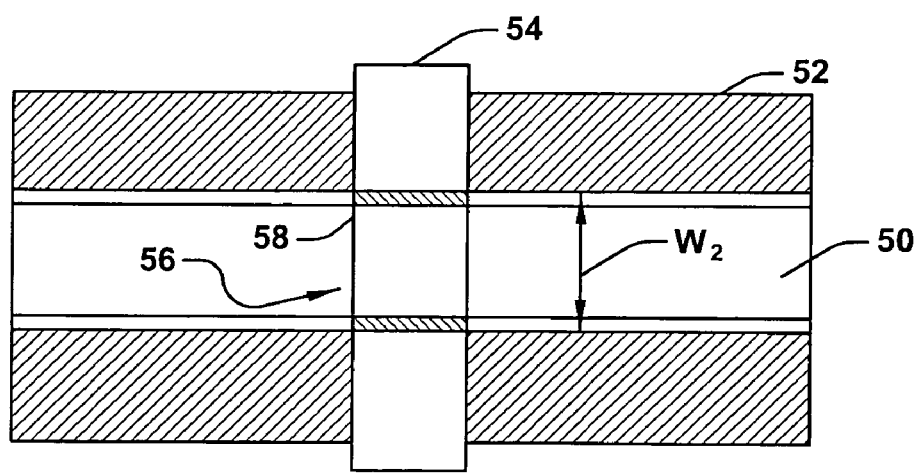
Figure 6:
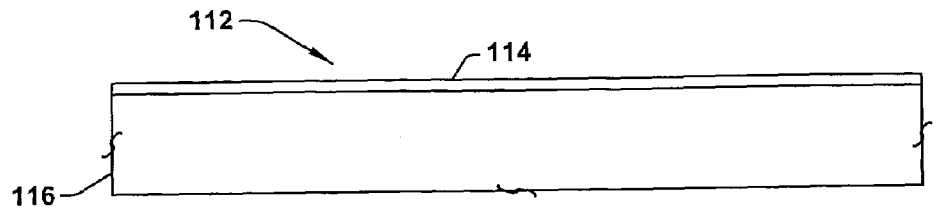
FIGS. 6–12 are prior art partial side elevation views in section illustrating a conventional shallow trench isolation process for providing isolation between active areas in a semiconductor device.
Figure 7:
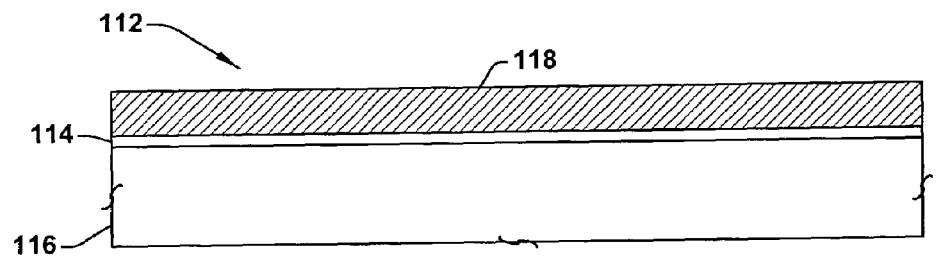
Figure 8:
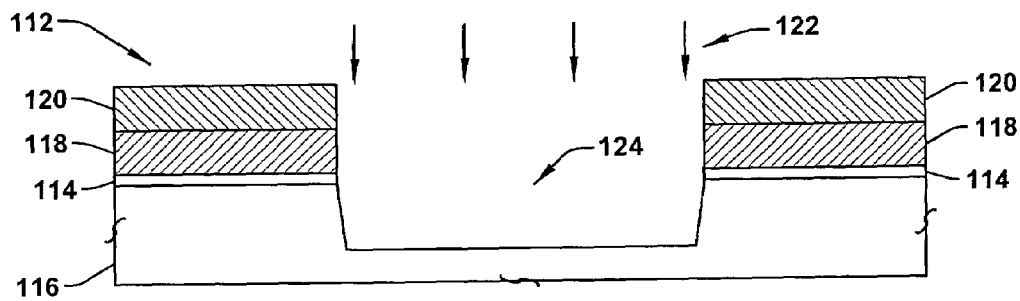
Figure 9:
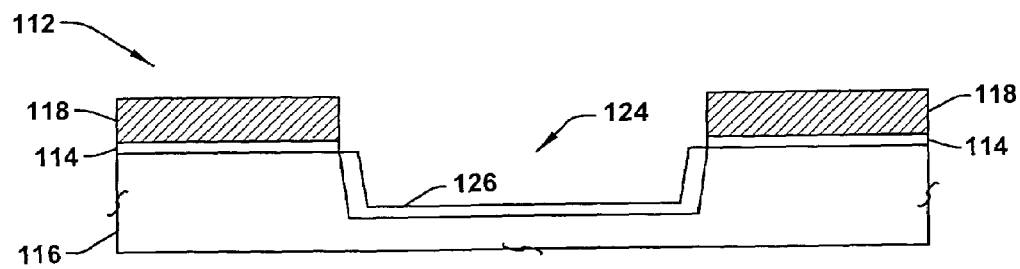

The present invention will now be described with reference to the attached drawings, wherein like reference numerals are used to refer to like elements throughout. The invention relates to methods for forming isolation structures and trenches in semiconductor devices, in which the negative impacts of the INWE are eliminated or substantially mitigated without the addition of extra mask steps. In addition, the method according to one exemplary aspect of the invention advantageously operates to improve a balance or minimize an imbalance of the threshold voltage performance of NMOS and PMOS transistors.

In order to fully appreciate the various aspects of the present invention, a brief description of a conventional STI fabrication process will be discussed. After a discussion thereof, the various aspects of the present invention will be disclosed and fully appreciated. In the fabrication of semiconductor devices, isolation structures are formed between active areas in which electrical devices such as transistors, memory cells, or the like, are to be formed. The isolation structures, in this case shallow trench isolation (STI) structures, are typically formed during initial processing of a semiconductor substrate, prior to the formation of such electrical devices.

STI isolation techniques involve the formation of shallow trenches in the isolation areas or regions of a semiconductor wafer, which are subsequently filled with dielectric material such as silicon dioxide ($SiO_2$) to provide electrical isolation between devices subsequently formed in the active regions on either side of the filled trenches. A pad oxide layer and a nitride layer are typically formed over the substrate surface and patterned to expose only the isolation regions, with the prospective active device regions covered. The nitride layer operates as a hard mask during subsequent processing steps, and the pad oxide layer functions to relieve stress between the underlying silicon substrate and the nitride layer. An anisotropic (e.g., "dry") etch is then performed to form a trench through the nitride, pad oxide, and substrate. Once the trench is etched, dielectric material is deposited to fill the trench with oxide. Thereafter, the device is commonly planarized using a chemical mechanical polishing (CMP) process and the nitride protection layer is removed.

A conventional STI process is illustrated in prior art FIGS. 6–12 to form trench isolation structures in a semiconductor device 112. In prior art FIG. 6, a thermal oxidation process is used to grow a pad oxide layer 114 over a semiconductor body 116. A nitride layer 118, such as $Si_3N_4$, is then deposited in prior art FIG. 7, such as by low-pressure chemical vapor deposition (LPCVD). The nitride layer 118 is used to protect the active regions of the semiconductor body (e.g., the substrate) 116 from adverse effects of the subsequent formation of isolation trenches between the active regions. The active regions of the device 112 are then masked in prior art FIG. 8 using a patterned etch mask 120 (e.g., a resist), leaving the isolation region of the nitride layer 118 exposed. A dry etch 122 is performed to form a trench 124 through the nitride layer 118, the pad oxide layer 114, and into the body region 116. The active mask 120 is then removed in prior art FIG. 9 and an oxide liner 126 is optionally formed in the trench 124 to remove or repair substrate damage caused by the trench etch process 122.

Figure 10:
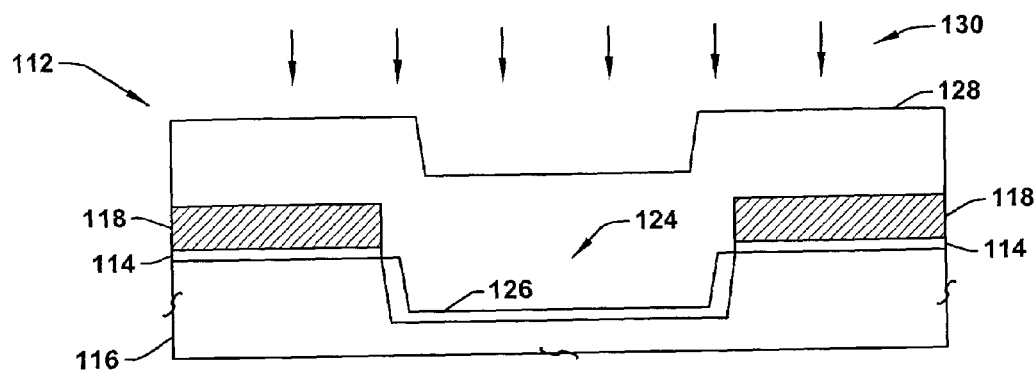
Figure 11:
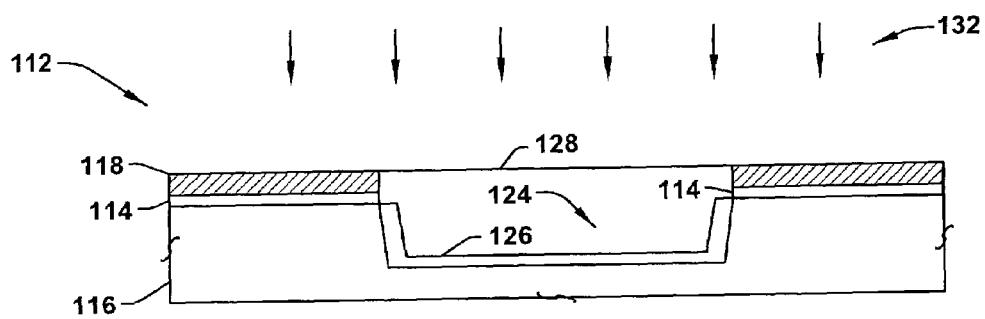
Figure 12:
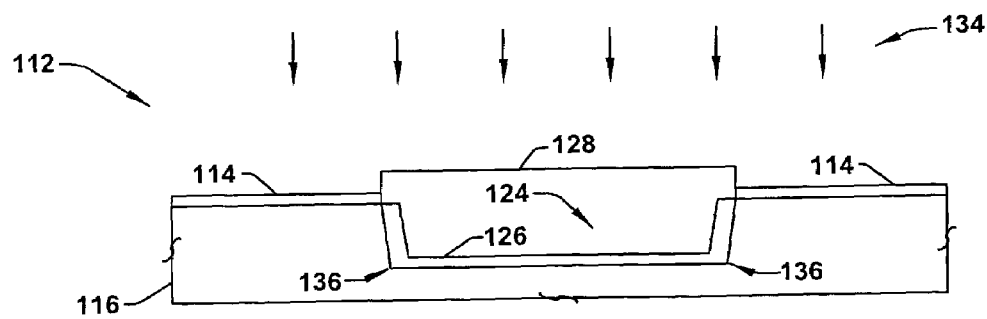

Once the trench 124 and the liner 126 are formed, a dielectric material 128 is deposited in prior art FIG. 10 via a deposition process 130 to fill the trench 124 and also to cover the nitride layer 118 in the active regions of the device 112. In prior art FIG. 11, a chemical mechanical polishing (CMP) or other planarization process 132 is used to planarize the upper surface of the device 112, which exposes the remainder of the nitride layer 118. Following planarization, the nitride layer 118 is removed via an etch process 134 in prior art FIG. 12 to complete the isolation process, leaving the STI structure 128 in the trench 124.

Figure 13:
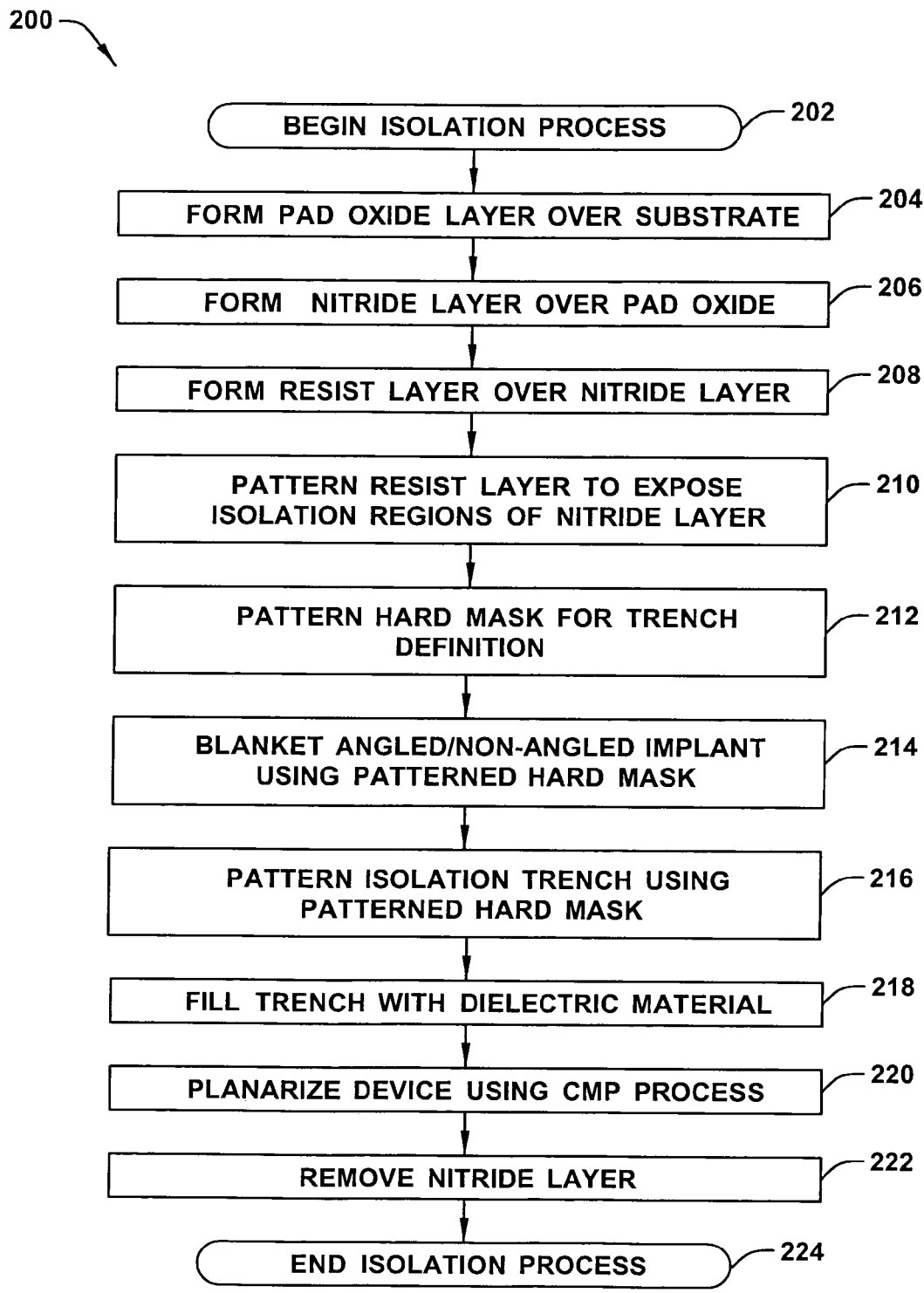
FIG. 13 is a flow chart diagram illustrating an exemplary method of forming an isolation trench in accordance with an aspect of the present invention.

Referring now to FIG. 13, an exemplary method 200 is illustrated and described for forming an isolation structure in a semiconductor device in accordance with one or more aspects of the invention. While the method 200, and other methods according to the invention, are illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention.

Beginning at 202, a pad oxide layer is formed over a semiconductor body such as the substrate at 204 and a nitride layer is formed over the pad oxide layer at 206. The pad oxide layer may be formed at 204 using any appropriate oxidation process, such as a thermal oxidation growth or a deposition process. The pad oxide layer may function to relieve stress between the underlying silicon substrate and the overlying nitride layer formed at 206, and/or to serve as an etch stop when removing the nitride layer later in the process, wherein the nitride layer operates as a hard mask in subsequent isolation processing, for example, to protect the underlying active regions of the substrate. The nitride layer may be formed at 206 using any appropriate deposition techniques and materials, such as $Si_3N_4$ deposited by low pressure chemical vapor deposition (LPCVD).

A resist layer is formed at 208 over the nitride layer, and patterned at 210 to form a patterned mask at 212 exposing isolation regions associated with the semiconductor body, while covering active regions thereof. The patterning of the resist mask at 210 may be accomplished according to known photolithography methodologies, such as by exposing select portions of the resist to a radiation source through a photomask, and removing either the exposed or the unexposed portions of the resist material (depending on the resist type) so as to uncover a portion of the nitride layer in the isolation regions and to leave the active regions covered with the nitride layer. The patterning of the nitride hard mask at 212 is performed, for example, with a anisotropic, dry etch to form isolation openings over the semiconductor body, wherein the openings are associated with the isolation regions. In one example, the nitride hard mask is completely etched, while in another embodiment, the nitride hard mask is partially removed in the area associated with the isolation region. Following patterning of the nitride hard mask at 212, the patterned resist may be removed, for example, by ashing.

A blanket implant is then performed at 214. In one example, with the nitride mask completely or substantially completely removed in the isolation region, the blanket implant is an angled implant, wherein the implant is blocked in the active regions by the nitride hard mask. The angled implant forms threshold voltage compensation regions in the semiconductor body associated with the isolation regions through the isolation openings in the nitride hard mask. Because the implant is an angled implant, a width of the resulting compensation regions is greater than a width of the isolation regions, as may be appreciated. In one example of the present invention, the angled implant is a quad angled implant, wherein a total implant dose is divided into four implants, wherein each implant is performed at substantially the same angle with the wafer being rotated 90 degrees after each implant. Alternatively, other type angled implants may be employed and are contemplated as falling within the scope of the present invention.

The angle associated with the implant may vary depending on a thickness of the nitride hard mask and the isolation opening. For one example, with an aspect ratio of the isolation opening being about 1:1, the angle of the implant will be less than 45 degrees. However, as may be appreciated, for differing aspect ratios, the angle may be increased or decreased appropriately to ensure dopant is implanted into the semiconductor body at least in regions that will extend laterally beyond the subsequently formed trench, as will be further appreciated infra.

According to another exemplary aspect of the invention, if the nitride hard mask is partially removed at 212, the blanket implant at 214 comprises an angled or preferably a non-angled implant. A non-angled implant will pass through the remaining portion of the nitride hard mask and experience scattering associated therewith. Consequently, the resulting threshold voltage compensation region formed in the semiconductor body experience a lateral straggle, wherein the resulting region is wider than a width of the isolation region as defined by the patterned nitride hard mask.

As may be appreciated, the implant energy through a portion of the nitride hard mask will be greater than if the patterned nitride hard mask is completely or substantially completely removed in the isolation regions. For example, with no nitride hard mask present on the isolation regions, the implant energy employed to implant dopant about 250–500 Angstroms into the semiconductor body will vary depending on the dopant employed. For example, an implant energy for boron may be about 8 keV-20 keV, an implant energy for arsenic may be about 50 keV-100 keV, and an implant energy for phosphorous may be about 20 keV- 60 keV. In order to implant to a similar depth through a portion of the patterned nitride hard mask, such energies would be increased by an amount depending on a thickness of the remaining nitride, as may be appreciated.

In one preferred aspect of the present invention, the semiconductor body is of a first conductivity type (e.g., a p-type material such as boron) and the angled implant comprises a dopant of a second, different conductivity type (e.g., an n-type material). Further, when employing an n-type implant dopant, the use of arsenic (As) is preferred. While any n-type dopant may be employed and is contemplated by the present invention, the n-type dopant preferably is As since As tends to diffuse less than phosphorous.

Still referring to FIG. 13, at 216, an isolation trench is patterned, for example, by dry etching using the patterned nitride hard mask formed at 212. The trench etch at 216 may be carried out using known trench etching techniques such as reactive ion etching (RIE). For example, a single or multi-step RIE etch process may be performed which removes material in the exposed isolation regions so as to etch through any remaining nitride or oxide associated with the hard mask and pad oxide, and etch into the semiconductor substrate so as to form a trench having sidewalls, and a bottom. The width of the insulation trench is associated with the isolation opening(s) in the nitride hard mask. Since the width of the threshold voltage compensation region is greater than a width of the trench, and since a depth of the trench is greater than that of the compensation regions, the trench formation breaks the compensation region into compensation sub-regions that surround one or more upper portions of the sidewalls of the trench.

At 218, the trench is filled with dielectric material such as SiO$_2$ or other electrically isolating material so as to provide electrical isolation between active regions on either side of the isolation trench. The trench filling operation at 218 may comprise forming or depositing dielectric material over the device to cover the nitride hard mask layer in the active regions and to fill the trenches in the isolation regions thereof. The trench fill material may be deposited at 218 using any appropriate deposition techniques, for example, such as high density plasma (HDP) oxide deposition, low pressure chemical vapor deposition (LPCVD) employing a tetraethylorthosilicate (TEOS) gas, or plasma enhanced chemical vapor deposition (PECVD) of silicon dioxide from TEOS and oxygen mixtures (PETEOS).

The device is then planarized at 220 to expose a portion of the nitride hard mask layer in the active regions, leaving a generally planar upper surface with portions of the nitride layer and a remaining portion of the fill material in the trench exposed. The remaining nitride material is stripped or removed at 222, for example, using a wet etch process selective so as to remove nitride material and to stop on the pad oxide layer without damaging the underlying silicon or other semiconductor material in the active regions of the device. The isolation method 200 then ends at 224. Thereafter, transistors, memory cells, and/or other electrical devices may be formed in the active regions using semiconductor processing techniques as are known.

During such formation of transistors in the active regions, the compensation sub-regions formed along top sidewall portions of the isolation trenches serve to alter an impact of the inverse narrow width effect (INWE) by providing the compensation dopant to account for or adjust dopant loss to the STI trench. For example, in the PMOS regions, an n-type compensation region adds to subsequently added n-type dopant in the PMOS active regions (e.g., due to formation of an N-well therein); and consequently any dopant loss from the region close to the STI trench is compensated by the compensation sub-regions so that the n-type dopant in the PMOS active region is more uniform. Accordingly, the threshold voltage of the resulting PMOS transistors increases despite the INWE effect. Consequently, the PMOS threshold voltages for narrow width devices may be increased, for example by about 10%. In one example, the threshold voltage was increased from about negative 0.3V to about negative 0.33V.

Conversely, in the NMOS regions, the n-type compensation regions provide for a net reduction in the charge associated with the p-type dopant in the NMOS regions (e.g., due to the p-type substrate or due to a p-type well region), thus causing a dopant loss to the STI trench to be exaggerated or increased. Thus the NMOS regions will experience increased dopant loss, thereby causing a decrease in the threshold voltage of NMOS transistors therein. In one example, the NMOS threshold voltages were decreased about 10%, from about 0.5V to about 0.45V. In the above manner, "cold" transistors are made more "warm", and "hot" transistors are made more "cool", such that the threshold voltage differences between the PMOS and NMOS devices may be decreased. Therefore the present invention provides another control knob for altering the threshold voltage of NMOS and PMOS transistors without an additional mask step.

While in the above example, an n-type dopant such as arsenic is employed in the implant to alter the threshold voltages as described, alternatively, the compensation implant may comprise a p-type dopant, wherein such dopant serves to adjust the threshold voltages of the PMOS and NMOS devices in the opposite directions. Such alternatives are contemplated as falling within the scope of the present invention.

Referring now to FIGS. 14–22, one exemplary implementation of the techniques provided by the exemplary method 200 of FIG. 13 is illustrated, wherein a semiconductor wafer or device 302 is processed to form isolation structures therein. It is noted at this point that the illustrations provided herein are not necessarily drawn to scale, and that the above method 200 may be employed in processing structures other than those illustrated in the following figures, and further that the structures illustrated and described herein may be fabricated according to other techniques.

Figure 14:
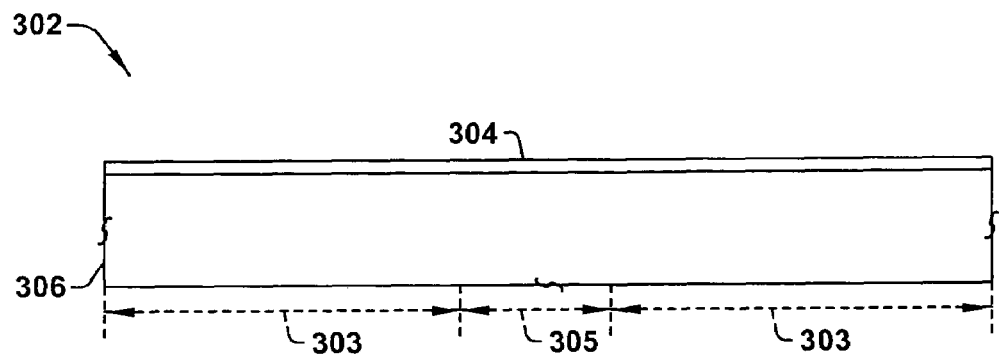
FIG. 14 is a partial side elevation view in section illustrating a pad oxide layer being formed over a semiconductor body in the fabrication of a trench isolation structure according to the invention.
Figure 15:
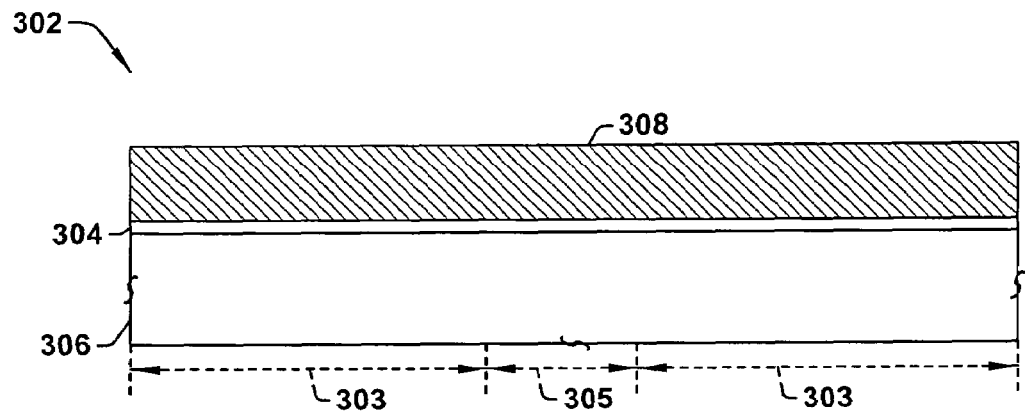
FIG. 15 is a partial side elevation view in section illustrating formation of a nitride hard mask layer over the pad oxide layer of FIG. 14.

In FIG. 14, the wafer 302 is illustrated comprising a semiconductor body (e.g., a substrate) 306, such as silicon having prospective active regions 303 (e.g., PMOS or NMOS regions) in which electrical devices are to be subsequently fabricated, as well as a prospective isolation region 305 in which an isolation structure is to be formed to isolate the active regions 303 from one another. An oxidation process (not shown) is initially employed to grow a pad oxide layer 304 over the top surface of the substrate 306 as illustrated in FIG. 14. A nitride hard mask layer 308 is then deposited in FIG. 15, such as by low pressure chemical vapor deposition (LPCVD) of $Si_3N_4$ or equivalent nitride or equivalent material.

Figure 16:
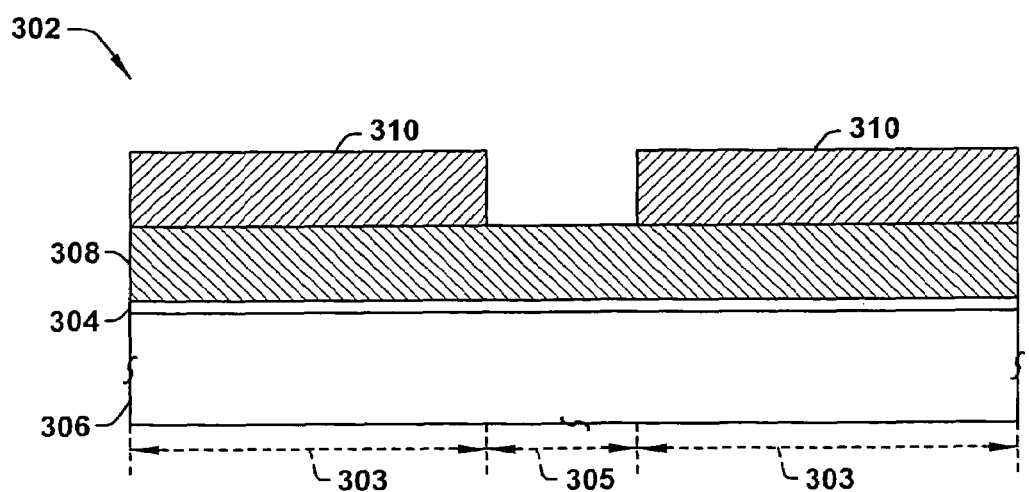
FIG. 16 is a partial side elevation view in section illustrating a patterned resist mask formed over the nitride hard mask layer to define an isolation region in the device of FIGS. 14 and 15.
Figure 17:
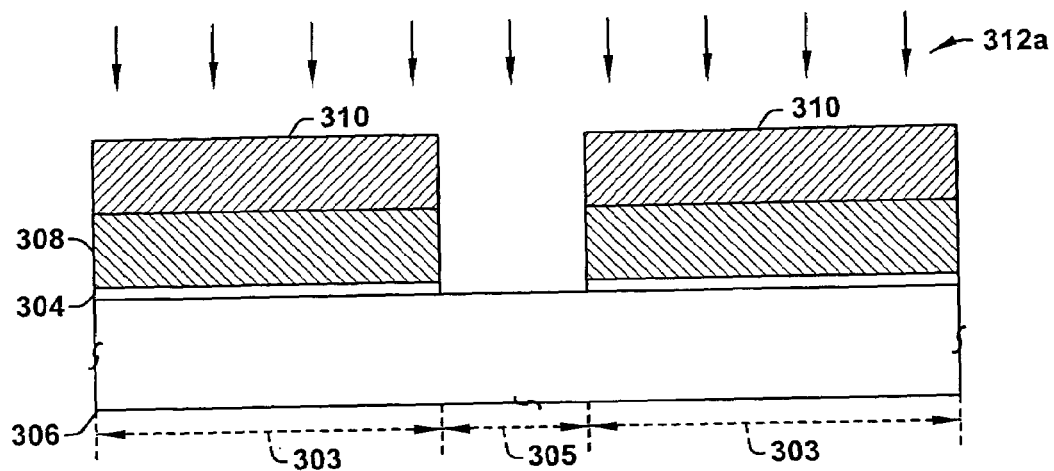
FIG. 17 is a partial side elevation view in section illustrating a dry etch process for patterning all or a portion of the nitride hard mask using the patterned resist mask to form an isolation opening associated with the isolation region in the semiconductor body.

Thereafter, in FIG. 16, a patterned mask 310 (e.g., a developed photoresist) is formed to cover the active regions 303 while exposing the nitride hard mask layer 308 in the isolation region 305 for subsequent trench formation therein. A dry etch process 312a is employed in FIG. 17, in one example, to etch through the nitride hard mask layer 308 and at least a portion of the pad oxide layer 304 to substantially expose the semiconductor body associated with the isolation region 305. Alternatively, the etch process 312a may etch only the nitride and land on the pad oxide. In yet another alternative, the etch process 312a may etch all of the exposed nitride and the underlying oxide and land on the underlying semiconductor material. In another example, the etch process 312a is employed to partially etch the nitride hard mask layer 308, wherein some portion of nitride layer remains overlying the isolation region 305. In one example, a remaining amount of nitride may be about 1,000 Angstroms, however, other remaining thicknesses are contemplated by the present invention.

Figure 18A:
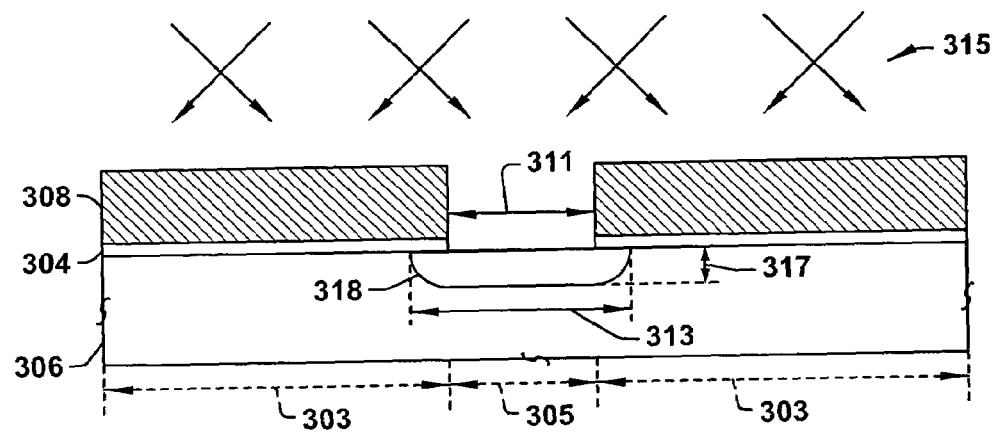
FIG. 18A is a partial side elevation view in section illustrating an angled implant into the isolation region using the patterned nitride hard mask as an implant mask to form a threshold adjustment region in the semiconductor body.

The resist mask 310 is then removed, and the wafer is removed from the etch tool, and placed in an ion implantation tool for a blanket angled ion implant. In one example, as illustrated in FIG. 18A, for a case where the nitride hard mask 308 is completely or substantially completely removed, an angled ion implant process 314a is performed, wherein a compensation region 318 is formed in the semiconductor body 306 in a region associated with the isolation region 305. As can be seen from FIG. 18A, however, a width 311 of the isolation opening (generally corresponding to the width of the isolation region 305) is less than a width 313 of the resultant threshold voltage compensation region 318 due to the angle of the implant. In addition, the compensation region 318 has a depth 317 associated therewith, wherein both the width 313 and the depth 317 are functions of the angle of the implant, a height of the isolation hard mask 308, and the energy of the implant, among other factors. Note that in the present example, the angled implant 314a is performed after removal of the resist mask 310 in order to allow for a greater implant angle without excessive shadowing by the implant mask 308. In the present example, the angled implant process 314a is a quad implant with an angle of approximately 35 degrees or less, however, other angles may be employed and are contemplated as falling within the scope of the present invention.

Figure 18B:
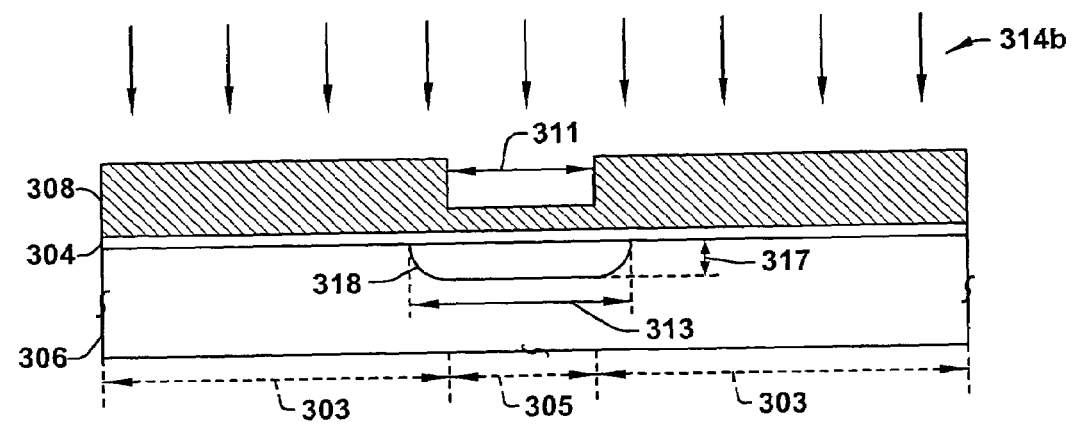
FIG. 18B is a partial side elevation view in section illustrating a non-angled angled implant into the isolation region using the patterned nitride hard mask as an implant mask to form a threshold adjustment region in the semiconductor body.

In another example, as illustrated in FIG. 18B, for a case where the nitride mask 308 is partially removed, a non-angled ion implant process 314b is performed, wherein a compensation region 318 is formed in the semiconductor body 306 in a region associated with the isolation region 305. As can be seen from FIG. 18B, a width 311 of the isolation opening (generally corresponding to the width of the isolation region 305) is less than a width 313 of the resultant threshold voltage compensation region 318 due to scattering of dopant as it passes through the remaining portion of the nitride hard mask 308. In addition, the compensation region 318 has a depth 317 associated therewith, wherein both the width 313 and the depth 317 are functions of the dose and energy of the implant, and a thickness of the remaining isolation hard mask portion 308 overlying the isolation region 305, among other factors. Note that in the present example, the non-angled implant 314b is performed after removal of the resist mask 310. Alternatively, the implant in FIG. 18B may be performed with an angled implant.

Figure 19:
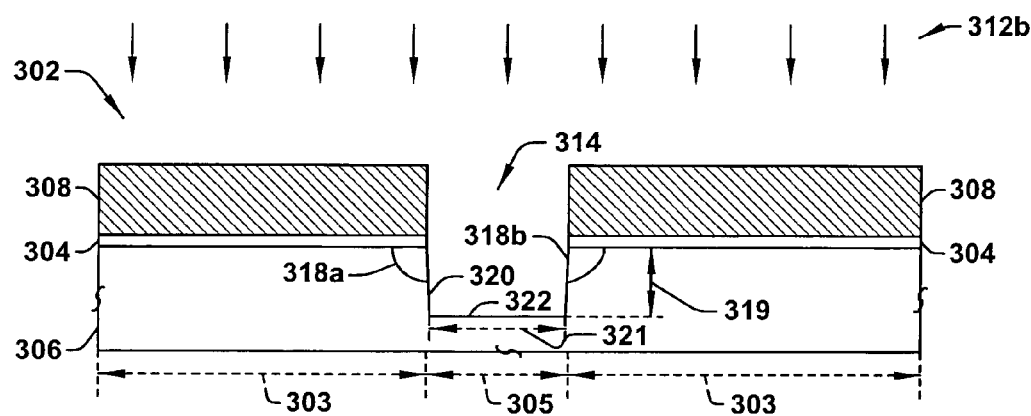
FIG. 19 is a partial side elevation view in section illustrating the formation of a trench in the isolation region of the semiconductor body of FIG. 18A or 18B, wherein the threshold adjustment regions reside on upper portions of the trench sidewalls according to another aspect of the invention.

Continuing with respect to FIG. 19, the wafer is returned to an etch tool, and an etch process 312b performed using the same isolation mask 308 to form an isolation trench 314 to a depth 319 and width 321 in the isolation region 305, where the trench comprises sidewalls 320 and a bottom 322. As illustrated in FIG. 19, the depth 319 of the trench is greater than a depth 317 of the compensation region 318 such that the compensation region is broken into compensation sub-regions 318a–318b that reside along upper portions of the trench sidewalls 320. Note that although the figure shows the trench splitting the compensation region 318 into discrete regions, it should be understood that the compensation sub-regions may be generally continuous peripheral regions that run along a peripheral sidewall of a trench, and in the instance of an island-shaped trench, the compensation sub-region(s) may encircle the trench 314 in a substantially continuous manner.

Figure 20:
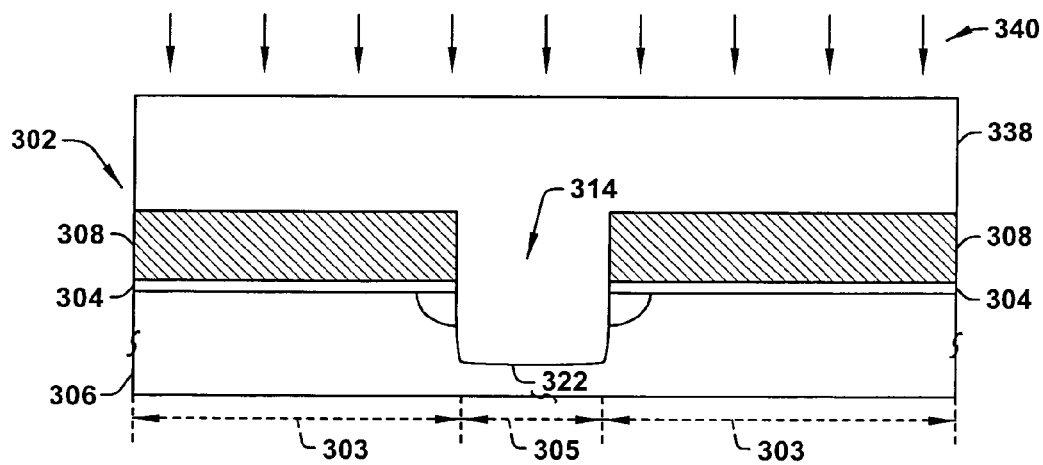
FIG. 20 is a partial side elevation view in section illustrating deposition of dielectric trench fill material into the trench and over the upper portions of the device of FIG. 19.

Referring now to FIG. 20, once the trench formation is complete, a liner (not shown) may optionally be formed in the trench 314, such as through oxidation of the exposed portions of the trench 314 using a thermal growth process. The trenches 314 are then filled in with electrically isolating material 338 via a deposition process 340, for example. The process 340 may involve any appropriate deposition methodologies as are known, such as depositing $SiO_2$ or other isolating material using a high density plasma (HDP) oxide deposition process, low pressure chemical vapor deposition (LPCVD) employing a tetraethylorthosilicate (TEOS) gas, or plasma enhanced chemical vapor deposition (PECVD) of silicon dioxide from TEOS and oxygen mixtures (PETEOS), although other fill materials and deposition processes are contemplated as falling within the scope of the appended claims.

Figure 21:
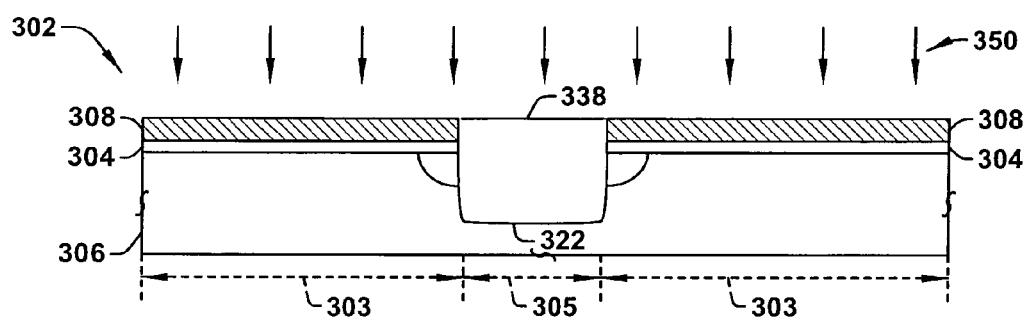
FIG. 21 is a partial side elevation view in section illustrating planarization of the device of FIG. 20 using a CMP process.
Figure 22:
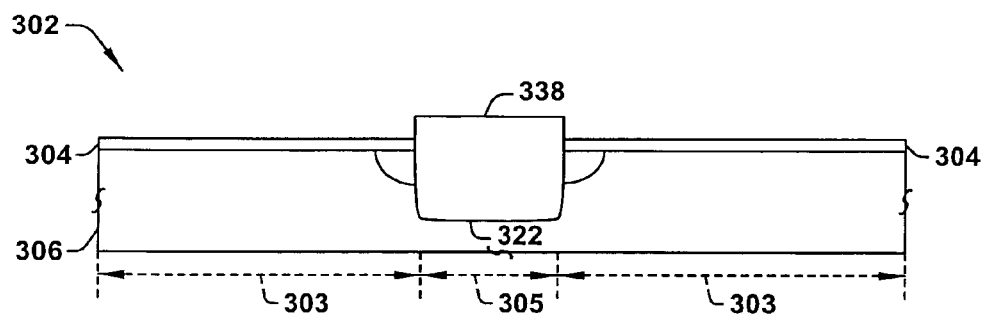
FIG. 22 is a partial side elevation view in section illustrating removal of the nitride hard mask layer from the device of FIG. 21.

Thereafter in FIG. 21, a planarization process 350 is performed to remove the upper portions of the fill material 338 as well as upper portions of the nitride hard mask layer 308, wherein the nitride layer 308 serves as a planarization stop. The process 350 preferably comprises a chemical-mechanical polishing (CMP) process wherein a generally planar upper surface is provided in the device 302. Subsequently in FIG. 22, the remainder of the nitride layer material 308 is stripped or otherwise removed, leaving a finished STI isolation structure comprising the trench 314 filled with dielectric material 338 surrounded by compensation sub-regions 318a–318b along upper sidewall portions of the trench. Thereafter, transistors, memory cells, and/or other electrical devices (not shown) may be formed in the active regions using semiconductor processing techniques as are known.

In the device of FIGS. 14–22, an implant (e.g., angled or non-angled) is performed after patterning (either completely or partially) the isolation hard mask in isolation regions, resulting in the formation of compensation regions associated with isolation regions in the semiconductor body. Subsequent to the implant, trenches are formed in the semiconductor body using the patterned isolation hard mask, wherein the trenches break the compensation regions into compensation sub-regions. As described herein, in one aspect of the invention, the compensation sub-regions are employed to alter the threshold voltages of NMOS and PMOS transistors in a semiconductor device. In addition, the compensation sub-regions are obtained without requiring an additional mask.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising."

What is claimed is:

1. A method of reducing a difference in threshold voltages between PMOS transistors and NMOS transistors in a CMOS device, comprising:

forming an isolation hard mask layer over an NMOS region and a PMOS region of a semiconductor body;

patterning the isolation hard mask layer, thereby defining isolation regions in both the NMOS region and the PMOS region of the semiconductor body, the isolation regions having a width associated therewith;

implanting an n-type dopant solely into the isolation regions of the semiconductor body using the patterned isolation hard mask, thereby forming threshold voltage compensation regions in both the NMOS and PMOS regions having a depth associated therewith, and the compensation regions having a width greater than the width of the isolation regions;

patterning the semiconductor body using the patterned isolation hard mask after performing the implant, thereby forming isolation trenches in the semiconductor body having a depth greater than the depth of the compensation regions and separating the compensation regions into compensation sub-regions on sides of the isolation trenches;

filling the isolation trenches with a dielectric material;

forming a p-type region in the NMOS region and an n-type region in the PMOS region either before or after implanting the n-type dopant in the isolation regions, wherein the n-type dopant within the compensation sub-regions causes an increase in p-type dopant loss to the isolation region in the NMOS region, and causes a decrease in n-type dopant loss to the isolation region in the PMOS region, thereby causing an increase in threshold voltage for NMOS transistors in the NMOS region and a decrease in threshold voltage for PMOS transistors in the PMOS region.

2. The method of claim 1, wherein forming and patterning the isolation hard mask comprises:

forming a pad oxide layer over the semiconductor body;

forming a nitride hard mask layer over the pad oxide layer;

forming a resist over the nitride hard mask layer;

patterning the resist to expose portions of the nitride hard mask layer corresponding to the isolation regions; and etching partially, substantially completely or completely the nitride hard mask in an area associated with the isolation region using the patterned resist as an etch mask.

3. The method of claim 2, wherein patterning the nitride hard mask layer comprises removing completely or substantially completely the nitride hard mask layer in the isolation region, and wherein implanting the n-type dopant comprises performing an angled ion implant of the n-type dopant into the isolation region.

4. The method of claim 2, wherein patterning the nitride hard mask layer comprises partially removing the nitride hard mask layer in the isolation region, thereby leaving a remaining portion of the nitride hard mask layer, and wherein the n-type dopant implant is a non-angled implant, wherein the n-type dopant scatters as it passes through the remaining portion of the nitride hard mask layer, thereby causing the width of the resultant threshold voltage compensation region to be greater than a width of the isolation region.

5. The method of claim 1, wherein filling the isolation trench comprises:

depositing an oxide material in the trench using an oxide deposition process; and planarizing the isolation structure using the nitride hard mask as a planarization step, wherein planarizing the isolation structure comprises performing a chemical mechanical polish (CMP) of the oxide material.

6. The method of claim 1, further comprising removing at least a portion of the isolation hard mask after filling the isolation trench.

* * * * *